United States Patent [19]

Treichel et al.

[11] Patent Number: 4,755,486
[45] Date of Patent: Jul. 5, 1988

[54] METHOD OF PRODUCING A DEFINED ARSENIC DOPING IN SILICON SEMICONDUCTOR SUBSTRATES

[75] Inventors: Helmuth Treichel, Augsburg; Frank S. Becker, Munich, both of Fed. Rep. of Germany

[73] Assignee: Siemens Aktiengesellschaft, Berlin and Munich, Fed. Rep. of Germany

[21] Appl. No.: 108,558

[22] Filed: Oct. 15, 1987

[30] Foreign Application Priority Data

Dec. 11, 1986 [DE] Fed. Rep. of Germany ....... 3642412

[51] Int. Cl.$^4$ .......................................... H01L 21/385
[52] U.S. Cl. .................................... 437/164; 437/240; 427/70
[58] Field of Search ................... 437/164, 240; 427/70

[56] References Cited

U.S. PATENT DOCUMENTS 4,693,781 9/1987 Leung et al. ........................ 156/643

OTHER PUBLICATIONS

Yamada et al., IEDM Tech. Digest 1985, pp. 702–705.
Becker et al., J. Electrochem. Soc. : Solidstate Sci and Techn., vol. 134, No. 11 (Nov. 1987), pp. 2923–2931.

Primary Examiner—Olik Chaudhuri
Attorney, Agent, or Firm—Hill, Van Santen, Steadman & Simpson

[57] ABSTRACT

A method of producing a defined arsenic doping in silicon semiconductor substrates is provided. Preferably, the arsenic doping is produced in the sidewalls and floors of trenches having high aspect ratio which are etched into the substrates. An arseno-silicate glass layer is deposited into these trenches to be used as a diffusion source, the glass layer being removed after the diffusion. The arseno-silicate glass layer is deposited by thermal decomposition from the vapor phase of tetraethylortho silicate Si)OC$_2$H$_5$)$_4$ and triethylarsenate AsO-(OC$_2$H$_5$)$_3$. A steep and reproducible doping profile having constant, maximum penetration depth and high arsenic concentration in the substrate surface which is needed for VLSI semiconductor circuits is obtained through the process of the present invention.

11 Claims, 1 Drawing Sheet

METHOD OF PRODUCING A DEFINED ARSENIC DOPING IN SILICON SEMICONDUCTOR SUBSTRATES

BACKGROUND OF THE INVENTION

The present invention relates generally to a method for producing an arsenic doping in silicon semiconductor substrates. More specifically, the present invention relates to a method for producing a defined arsenic doping in the side walls and floors of trenches having a high aspect ratio which are etched into a silicon semiconductor substrate, whereby an arseno-silicate glass layer deposited into these trenches is used as a diffusion source, this layer being removed after the diffusion.

In the development of VLSI circuits, for example the 4 megabit dynamic RAM, the planar cells are being increasingly replaced in the capacitor memory cells by trench (well) cells. This is due to the planar cells' greater space requirements. In order to increase the packing density of the memory cells, and thereby retain the storage capacity, trenches having a high aspect ratio of greater than or equal to 3 (the ratio of the depth of the trench to the width) are generated. In order to avoid leakage currents to neighboring memory cells and guarantee a high reliability of the circuit, a precisely controlled, steep n+ profile having low penetration depth is also required.

Given the high aspect ratio of such trenches, the drive-in from the doped glass layers (diffusion source) deposited there has been found to work satisfactorily for doping the side walls and floors. A more uniform doping is thereby achieved and the decrease of the dopant concentration in the direction toward the trench floor is reduced.

Arsenic is preferred as a dopant for generating conductivity regions of the n+ type. The diffusion length thereof is lower by a factor of 4 in comparison to phosphorous and thereby enables smaller spacings of the trenches.

A method for producing an arsenic doping in drive-in from doped glass layers is disclosed in an article by K. Yamada et al, *IEDM Technical Digest* 1985, pages 702–708. The method disclosed utilizes a LPCVD (low pressure chemical vapor deposition) reactor. An arseno-silicate glass layer (AsSG) is generated by the thermal decomposition of triethylarsenite (As(OC$_2$H$_5$)$_3$, TEAsite) and tetraethylortho-silicate (TEOS, Si(OC$_2$H$_5$)$_4$) and arsenic is driven into the substrate by a high-temperature process.

The disadvantages of this method include the fact that there is a high material consumption relative to the obtainable level of the doping. In view of the high material costs involved, this makes the method not entirely satisfactory from an economic standpoint. Moreover, the decomposition products that result from the process make frequent cleaning of the filters, pumps, and other vacuum parts necessary. This creates further problems due to the toxicity of these decomposition products that include arsenic-containing components. As a consequence of the frequently required cleanings, a low throughput of the LPCVD system per time unit is obtained, this likewise makes the process more costly and less economical.

Further, in order to achieve a steep doping profile, it is necessary to pre-treat the substrate. Furthermore, it is necessary to set an exact atmosphere composition during the high-temperature diffusion process (drive-in).

There is therefore a need for an improved method for producing a defined arsenic doping.

SUMMARY OF THE INVENTION

The present invention provides an improved method for producing a defined arsenic doping. To this end, the AsSG layer, in an embodiment of the method of the present invention, is deposited by thermal decomposition from the vapor phase of tetraethylortho-silicate, (Si(OC$_2$H$_5$)$_4$, TEOS) and triethylarsenate (AsO(OC$_2$H$_5$)$_3$, TEAsate).

In a preferred embodiment of the invention, the AsSG layer is deposited at approximately 650° to about 750° C., and a pressure of approximately 0.5 to about 1.1 mbar is utilized with oxygen being added to the reaction gases.

An advantage of the present invention is that it provides a method for producing a defined arsenic doping that is cost-effective.

A further advantage of the present invention is that it provides a method for producing a defined arsenic doping that has fewer waste disposal problems than prior methods of arsenic doping.

Moreover, an advantage of the present invention is that there is a reduced dependency on the method parameters during drive-in.

Additional features and advantages of the present invention are described in and will be apparent from the detailed description of the presently preferred embodiments and from the drawings.

DETAILED DESCRIPTION OF THE PRESENTLY PREFERRED EMBODIMENTS

The present invention provides an improved method for producing an arsenic doping in silicon semiconductor substrates. The method preferably is designed for producing a defined arsenic doping in the side walls and floors of trenches having a high aspect ratio that are etched in the substrates. The arseno-silicate glass layer is deposited into the trenches and used as a diffusion source, the layer is then removed after the diffusion.

Figure 1:
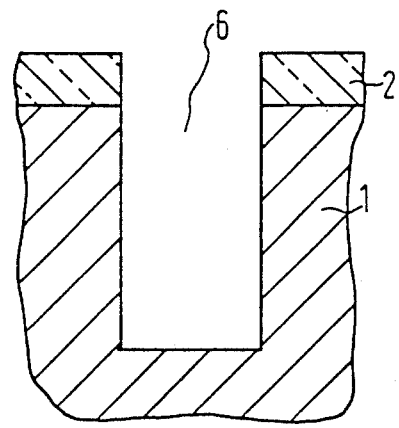
FIG. 1 illustrates a trench in a silicon substrate which exhibits a high aspect ratio.

Referring to FIG. 1, a substrate 1 composed of silicon and covered with a silicon oxide layer 2 having a trench 6 etched therein is illustrated. By way of example, the trench 6 illustrated has a width of approximately 1 um and a depth of approximately 3 um.

In a hot-wall, horizontal LPCVD system, the substrate wafers 1 and silicon oxide layer 2 having these trenches 6 are coated with an arseno-silicate glass layer on open boats (wafer spacing about 4 mm) by the decomposition of tetraethylorthosilicate (Si(OC$_2$H$_5$)$_4$, TEOS) and triethylarsenate (AsO(OC$_2$H$_5$)$_3$, TEAsate).

Figure 2:
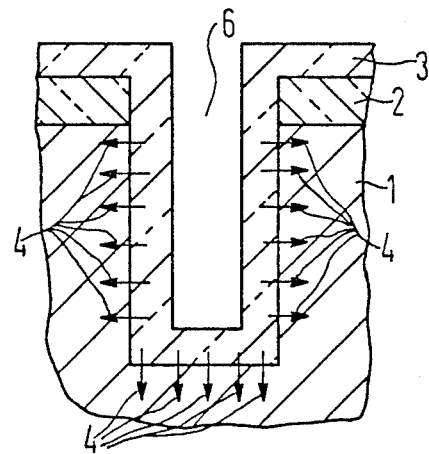
FIG. 2 illustrates the trench of FIG. 1 with an arseno-silicate glass layer deposited thereon.

FIG. 2 illustrates the substrate 1 after the arsenosilicate glass (AsSG) layer 3 has been deposited in the trench 2. The AsSG layer 3 is deposited at a temperature of approximately 650° to about 750° C. and a pressure of approximately 0.5 to about 1.1 mbar. In a preferred embodiment, the AsSG layer 3 is deposited at a mean temperature of approximately 710° C. and a pressure of approximately 920 mbar. The gas transport is regulated via carrier gases $O_2$ for TEOS and $N_2$ for TEAsate. The arsenic content of the AsSG layer 3 can be set at values from approximately 2 to about 8 weight percent of arsenic via the temperature of the TEAsate evaporator. A high layer uniformity is achieved on the basis of the oxygen admixture.

Preferably, the reactor used for deposition of the AsSG layer 3 is that disclosed in German Patent Application No. P 35 18 452.3, the disclosure of which is incorporated herein by reference.

By heating the substrate 1, silicon oxide layer 2, and AsSG layer 3 to approximately 1000° C., a diffusion of arsenic atoms, indicated by the arrows 4, into the substrate 1 is achieved. After a tempering time of approximately 60 minutes in a 9:1 $N_2/O_2$ atmosphere, the drive-in process is concluded.

Figure 3:
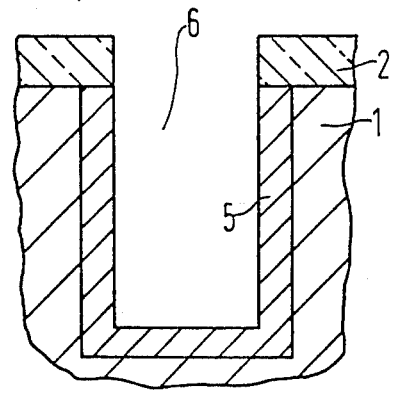
FIG. 3 illustrates the trench of FIG. 2 after diffusion and after the silicate glass layer has been removed.

FIG. 3 illustrates the substrate 1 and trench 6 after the removal of the AsSG layer 3 with wet-etching. The floor and walls of the trench 6 now exhibit a defined n+ doping having a surface concentration of more than $10^{20}$ atoms/cm$^3$. The arsenic content remains approximately uniform up to a penetration depth of approximately 150 nanometers and then drops steeply. This steep doping profile is necessary in order to avoid an electrical punch-through in the later trench cell.

Through the method of the present invention, the achieved doping exhibits a high uniformity of approximately ±5% over the entire substrate. This uniformity even extends over the entire batch and is reproducible.

Through the method of the present invention, the consumption of arsenic compound per process carried out is reduced to 1/10 of the value required when compared to processes using TEAsite. Given the same price per gram of arsenic compound for TEAsite and TEAsate, material costs are thereby reduced by a factor of 10.

Because the throughput of arsenic-containing decomposition products is greatly reduced through the method of the present invention, the length of time between waste disposal in the system is consequently lengthened as well as the length of time between cleaning of the filters. Similarly, the environmental pollution of the arsenic-containing decomposition products is greatly reduced through the method of the present invention.

Further, the pentavalent arsenic exhibits an improved diffusion behavior. The doping profile becomes steeper and, at the same time, the total concentration of arsenic at the substrate surface is increased. A high arsenic concentration is retained (above $10^{20}$ atoms per cm$^3$) up to about 150 nanometers of penetration depth and then drops steeply.

An improvement in the operational reliability of the method of the present invention derives from the vapor pressure of the TEAsate which is lower in comparison to TEAsite. This reduces the risk of accidental poisioning in the event of an unintentional opening of the evaporator or due to some other accidental emergence of TEasate.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method of producing a defined arsenic doping in the sidewalls and floors of trenches etched in semiconductor substrates, wherein an arseno-silicate glass layer is deposited into these trenches and used as a diffusion source, the glass layer being removed after the diffusion, comprising the step of depositing the arseno-silicate glass layer in the trench by thermal decomposition from the vapor phase of tetraethylortho silicate (Si(OC$_2$H$_5$)$_4$) and triethylarsenate (AsO(OC$_2$H$_5$)$_3$).

2. The method of claim 1 wherein the arseno-silicate glass layer is deposited at approximately 650° to about 750° C.

3. The method of claim 1 wherein the pressure at which the arseno-silicate glass layer is deposited is approximately 0.5 to about 1.1 mbar.

4. The method of claim 1 wherein oxygen is added to decomposing gases.

5. The method of claim 2 wherein the pressure at which the arseno-silicate glass layer is deposited is approximately 0.5 to about 1.1 mbar.

6. The method of claim 3 wherein oxygen is added to decomposing gases.

7. The method of claim 5 wherein oxygen is added to decomposing gases.

8. A method of producing a defined arsenic doping in semiconductor substrates having trenches etched therein comprising the steps of:

depositing an arseno-silicate glass layer by thermal decomposition from the vapor phase of tetraethylortho silicate (Si(OC$_2$H$_5$)$_4$) and triethylarsenate (AsO(OC$_2$H$_5$)$_3$) at temperatures of approximately 650° to about 750° C. into the trenches to be used as a diffusion source; and removing the arseno-silicate glass layer after the diffusion.

9. The method of claim 8 wherein oxygen is added to decomposing gases.

10. The method of claim 8 wherein the arseno-silicate glass layer is deposited on the substrate in a horizontal LPCVD system.

11. The method of claim 8 wherein the arseno-silicate glass layer is deposited at a mean temperature of approximately 710° C. and a pressure of approximately 920 mbar.

* * * * *